United States Patent
Takahashi et al.

(10) Patent No.: US 10,541,138 B2
(45) Date of Patent: Jan. 21, 2020

(54) DIFFUSING AGENT COMPOSITION AND METHOD OF MANUFACTURING SEMICONDUCTOR SUBSTRATE

(71) Applicant: TOKYO OHKA KOGYO CO., LTD., Kawasaki-shi (JP)

(72) Inventors: Yu Takahashi, Kawasaki (JP); Keisuke Kubo, Kawasaki (JP)

(73) Assignee: TOKYO OHKA KOGYO CO., LTD., Kawasaki-Shi (JP)

(*) Notice: Subject to any disclaimer, the term of this patent is extended or adjusted under 35 U.S.C. 154(b) by 0 days.

(21) Appl. No.: 16/049,030

(22) Filed: Jul. 30, 2018

(65) Prior Publication Data

US 2019/0043724 A1 Feb. 7, 2019

(30) Foreign Application Priority Data

Aug. 4, 2017 (JP) ................. 2017-151973

(51) Int. Cl.
| | |
|---|---|
| *H01L 21/22* | (2006.01) |
| *H01L 21/225* | (2006.01) |
| *C09D 7/63* | (2018.01) |
| *C09D 5/24* | (2006.01) |
| *H01L 21/02* | (2006.01) |

(52) U.S. Cl.
CPC ............ *H01L 21/2256* (2013.01); *C09D 5/24* (2013.01); *C09D 7/63* (2018.01); *H01L 21/2225* (2013.01); *H01L 21/2254* (2013.01); *H01L 21/02129* (2013.01); *H01L 21/02282* (2013.01)

(58) Field of Classification Search
CPC .......... H01L 21/2256; H01L 21/02129; H01L 21/02282; C09D 7/63; C09D 5/24; C09D 5/52
See application file for complete search history.

(56) References Cited

U.S. PATENT DOCUMENTS

2016/0293425 A1* 10/2016 Sawada ............... H01L 21/2225

FOREIGN PATENT DOCUMENTS

| JP | H06-318559 | 11/1994 |
|---|---|---|
| WO | WO 2014/064873 | 5/2014 |

* cited by examiner

*Primary Examiner* — Victor A Mandala
*Assistant Examiner* — Colleen E Snow
(74) *Attorney, Agent, or Firm* — Knobbe, Martens, Olson & Bear LLP

(57) ABSTRACT

A diffusing agent composition that can efficiently form a thin film in which an impurity diffusion component can be diffused into a semiconductor substrate at a higher concentration than a conventional one and a method of manufacturing a semiconductor substrate using the diffusing agent composition. The diffusing agent composition includes an impurity diffusion component and a silane coupling agent the silane coupling agent including a group which generates a silanol group by hydrolysis and alkyl groups and at least one of the alkyl groups includes, in a chain and/or at an end, at least one amino group selected from a primary amino group, a secondary amino group and a tertiary amino group.

9 Claims, No Drawings

DIFFUSING AGENT COMPOSITION AND METHOD OF MANUFACTURING SEMICONDUCTOR SUBSTRATE

This application claims priority to Japanese Patent Application No. 2017-151973, filed Aug. 4, 2017, the entire content of which is incorporated herein by reference.

BACKGROUND OF THE INVENTION

Field of the Invention

The present invention relates to a diffusing agent composition which is used for diffusing an impurity diffusion component into a semiconductor substrate and a method of manufacturing a semiconductor substrate using the diffusing agent composition.

Related Art

Semiconductor substrates used in semiconductor elements such as transistors, diodes and solar batteries are manufactured by diffusing impurity diffusion components such as phosphorus and boron into the semiconductor substrates. With respect to the semiconductor substrates described above, when a semiconductor substrate for a multi-gate element such as a Fin-FET or a nanowire FET is manufactured, for example, an impurity may be diffused into a semiconductor substrate which includes, on its surface, a three-dimensional structure having small air gaps on a nanometer scale.

Here, as a method of diffusing the impurity diffusion component into the semiconductor substrate, for example, an ion implantation method (see, for example, Patent Document 1) and a CVD method (see, for example, Patent Document 2) are known. In the ion implantation method, an ionized impurity diffusion component is implanted into the surface of a semiconductor substrate. In the CVD method, an oxide film such as a silicon oxide doped with an impurity diffusion component such as phosphorus or boron is formed on a semiconductor substrate by CVD, and thereafter the semiconductor substrate having the oxide film is heated with an electric furnace or the like, with the result that the impurity diffusion component is diffused from the oxide film into the semiconductor substrate.

Patent Document 1: Japanese Unexamined Patent Application, Publication No. H06-318559
Patent Document 2: PCT International Publication No. WO2014/064873

SUMMARY OF THE INVENTION

However, in the ion implantation method as disclosed in Patent Document 1, when a light ion such as B (boron) is implanted into the semiconductor substrate, in a region near the surface of the substrate, a point defect or a point defect cluster is easily formed. For example, when an impurity diffusion component is diffused by the ion implantation method into a semiconductor substrate, and thus an element such as a CMOS image sensor is formed, the occurrence of such a defect directly leads to a reduction in the performance of the element.

For example, when a semiconductor substrate includes, on its surface, a three-dimensional structure on a nanometer scale such as a three-dimensional structure for forming a multi-gate element called a Fin-FET which includes a plurality of source fins, a plurality of drain fins and gates orthogonal to those fins, in the ion implantation method, it is difficult to uniformly implant ions into the side surface and the upper surface of the fins and gates and the entire inner surface of a concave portion surrounded by the fins and the gates. The non-uniformity of the diffusion of an impurity into a semiconductor substrate having a three-dimensional structure on a nanometer scale is also a factor for lowering the performance of an element such as the CMOS image sensor described above.

When an impurity diffusion component is diffused by the ion implantation method into a semiconductor substrate having a three-dimensional structure on a nanometer scale, even if the uniform implantation of ions is achieved, there are failures which will be described below. For example, when a semiconductor substrate which includes a three-dimensional pattern having small fins is used so as to form a logic LSI device or the like, the crystal of a substrate material such as silicon is easily damaged by ion plantation. It is considered that the damaged crystal causes a failure such as a variation in the property of the device or the production of a standby leak current.

When the CVD method disclosed in Patent Document 2 is applied, by an overhang phenomenon, it is difficult to coat the entire inner surface of a concave portion surrounded by fins and gates with an oxide film whose film thickness is uniform and which includes an impurity diffusion component, and an opening portion is disadvantageously blocked by an oxide deposited on the opening portion in the concave portion surrounded by the fins and the gates. As described above, in the ion implantation method and the CVD method, depending on the shape of the surface of the semiconductor substrate, it is difficult to satisfactorily and uniformly diffuse the impurity diffusion component into the semiconductor substrate.

In the semiconductor substrate which includes, on its surface, a three-dimensional structure on a nanometer scale, in order to enhance the uniformity of the diffusion of an impurity diffusion component, a coating-type diffusing agent composition is considered to be used. In the substrate which includes, on its surface, a three-dimensional structure having small air gaps on a nanometer scale, all surfaces including the entire inner surface of the small air gaps can be uniformly coated with the coating-type diffusing agent composition, and thus in the semiconductor substrate having a three-dimensional surface, an impurity such as boron can be uniformly diffused.

However, even when the coating-type diffusing agent composition is used, depending on the composition of the diffusing agent composition, it may be difficult to satisfactorily diffuse the impurity diffusion component into the semiconductor substrate.

The present invention is made in view of the foregoing problems, and an object thereof is to provide a diffusing agent composition in which an impurity diffusion component can be satisfactorily diffused into a semiconductor substrate and a method of manufacturing a semiconductor substrate using the diffusing agent composition described above.

The present inventors find that it is possible to solve the foregoing problems by including, in a diffusing agent composition including an impurity diffusion component (A), a silane coupling agent which includes an alkyl group having at least one amino group, and thereby complete the present invention. More specifically, the present invention is as follows.

A first aspect of the present invention is a diffusing agent composition which is used for diffusing an impurity into a semiconductor substrate, wherein the diffusing agent composition comprises an impurity diffusion component (A) and a silane coupling agent (B), the silane coupling agent (B) includes a group which generates a silanol group by hydrolysis and alkyl groups and at least one of the alkyl groups comprises, in a chain and/or at an end, at least one amino group selected from a group consisting of a primary amino group, a secondary amino group and a tertiary amino group.

A second aspect of the present invention is a method of manufacturing a semiconductor substrate which comprises: forming a coating film by applying the diffusing agent composition according to the first aspect onto a semiconductor substrate; and diffusing the impurity diffusion component (A) in the diffusing agent composition into the semiconductor substrate.

According to the present invention, it is possible to provide a diffusing agent composition in which an impurity diffusion component can be satisfactorily diffused into a semiconductor substrate and a method of manufacturing a semiconductor substrate using the diffusing agent composition described above.

DETAILED DESCRIPTION OF THE EMBODIMENTS

Although an embodiment of the present invention will be described in detail below, the present invention is not limited at all to the embodiment below, and within the scope of the object of the present invention, the embodiment can be changed as necessary so as to be practiced.

<<Diffusing Agent Composition>>

A diffusing agent composition is used for diffusing an impurity into a semiconductor substrate, and includes an impurity diffusion component (A) and a silane coupling agent (B). Essential or arbitrary components included in the diffusing agent composition will be described below.

[Impurity Diffusion Component (A)]

The impurity diffusion component (A) is not particularly limited as long as the impurity diffusion component (A) is a component which is conventionally used for doping the semiconductor substrate, and any one of a p-type dopant and an n-type dopant may be used. Examples of the p-type dopant include simple substances such as boron, gallium, indium and aluminum and compounds including such elements. Examples of the n-type dopant include simple substances such as phosphorus, arsenic and antimony and compounds including such elements.

A boron compound and a phosphorus compound will be individually described below.

(Boron Compound)

The boron compound is not particularly limited as long as the compound achieves the effects of the invention in the present application. A preferable boron compound which can be mentioned is one or more types selected from a group consisting of compounds represented by formulas (a1) to (a4) below:

[Formula 1]

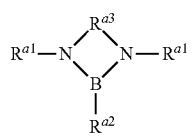
(a1)

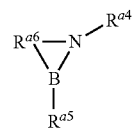
(a2)

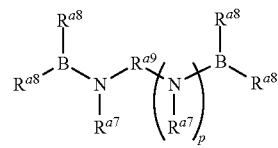
(a3)

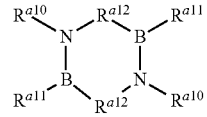
(a4)

(in the formula (a1), $R^{a1}$ each independently represents a hydrogen atom, a hydrocarbon group having 1 or more and 10 carbon or less atoms, $R^{a1}$ represents a hydrogen atom or a hydrocarbon group having 1 or more and 10 or less carbon atoms, at least one of $R^{a1}$ and $R^{a2}$ is a hydrocarbon group and $R^{a3}$ represents a divalent aliphatic hydrocarbon group having 1 or more and 10 or less carbon atoms; in the formula (a2), $R^{a4}$ represents a hydrocarbon group having 1 or more and 10 or less carbon atoms, $R^{a5}$ represents a hydrogen atom or a hydrocarbon group having 1 or more and 10 or less carbon atoms and $R^{a6}$ represents a divalent aliphatic hydrocarbon group having 1 or more and 10 or less carbon atoms; in the formula (a3), $R^{a7}$ each independently represents a hydrocarbon group having 1 or more and 10 or less carbon atoms, $R^{a8}$ each independently represents a hydrogen atom or a hydrocarbon group having 1 or more and 10 or less carbon atoms, $R^{a9}$ represents a divalent hydrocarbon group having 1 or more and 10 or less carbon atoms and p represents 0 or 1; and in the formula (a4), $R^{a10}$ each independently represents a hydrogen atom, a hydrocarbon group having 1 or more and 10 or less carbon atoms, $R^{a11}$ each independently represents a hydrogen atom or a hydrocarbon group having 1 or more and 10 or less carbon atoms, at least one of $R^{a10}$ and $R^{a11}$ is a hydrocarbon group and $R^{a12}$ each independently represents a divalent hydrocarbon group having 1 or more and 10 or less carbon atoms).

(Compound Represented by Formula (a1))

In the formula (a1), $R^{a3}$ each independently represents a hydrogen atom, a hydrocarbon group having 1 or more and 10 or less carbon atoms, $R^{a2}$ represents a hydrogen atom or a hydrocarbon group having 1 or more and 10 or less carbon atoms and $R^{a3}$ represents a divalent aliphatic hydrocarbon group having 1 or more and 10 or less carbon atoms. However, at least one of $R^{a1}$ and $R^{a2}$ is a hydrocarbon group. The hydrocarbon groups having 1 or more and 10 or less carbon atoms and serving as $R^{a1}$ and $R^{a2}$ may be an aliphatic hydrocarbon group, an aromatic hydrocarbon group or a group obtained by combining them. Specific examples of the suitable hydrocarbon group include: alkyl groups such as a methyl group, an ethyl group, an n-propyl group, an isopropyl group, an n-butyl group, an isobutyl group, a sec-butyl group, a tert-butyl group, an n-pentyl group, an n-hexyl group, an n-heptyl group, an n-octyl group, a 2-ethylhexyl group, an n-nonyl group and an n-decyl group; cycloalkyl groups such as a cyclopropyl group, a cyclobutyl group, a cyclopentyl group, a cyclohexyl group, a cycloheptyl group, a cyclooctyl group, a cyclononyl group and a cyclodecyl group; alkenyl groups such as a vinyl group, an allyl group (2-propenyl group), a 3-butenyl group, a 4-pentenyl group and a 5-hexenyl group; aromatic hydrocarbon groups such as a phenyl group, a naphthalen-1-yl group and a naphthalen-2-yl group; aralkyl groups such as a benzyl group and a phenethyl group; alkyl-substituted aromatic hydrocarbon groups such as an o-tolyl group, a m-tolyl group, a p-tolyl group, an o-ethylphenyl group, a m-ethylphenyl group and a p-ethylphenyl group. As $R^{a1}$, a methyl group, an ethyl group, an n-propyl group, an isopropyl group, an n-butyl group, an isobutyl group, a sec-butyl group, a tert-butyl group, a phenyl group and a benzyl group are preferable. As $R^{a2}$, a hydrogen atom, a methyl group, an ethyl group, an n-propyl group, an isopropyl group, an n-butyl group, an isobutyl group, a sec-butyl group, a tert-butyl group, a phenyl group and a benzyl group are preferable.

Although the aliphatic hydrocarbon group serving as $R^{a3}$ may be linear or branched, the aliphatic hydrocarbon group is preferably linear. Examples of the suitable $R^3$ include a methylene group, an ethane-1,2-diyl group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group and a decane-1,10-diyl group. As $R^{a3}$, the ethane-1,2-diyl group and the propane-1,3-diyl group are preferable.

(Compound Represented by Formula (a2))

In the formula (a2), $R^{a4}$ represents a hydrocarbon group having 1 or more and 10 or less carbon atoms, $R^{a5}$ represents a hydrogen atom or a hydrocarbon group having 1 or more and 10 or less carbon atoms and $R^{a6}$ represents a divalent aliphatic hydrocarbon group having 1 or more and 10 or more carbon atoms. Examples of the suitable hydrocarbon group having 1 or more and 10 or less carbon atoms which serves as $R^{a4}$ and $R^{a5}$ are the same as the examples of the suitable $R^{a1}$ and $R^{a2}$. As $R^{a4}$, a methyl group, an ethyl group, an n-propyl group, an isopropyl group, an n-butyl group, an isobutyl group, a sec-butyl group, a tert-butyl group, a phenyl group and a benzyl group are preferable. As $R^{a5}$, a hydrogen atom, a methyl group, an ethyl group, an n-propyl group, an isopropyl group, an n-butyl group, an isobutyl group, a sec-butyl group, a tert-butyl group, a phenyl group and a benzyl group are preferable. Examples of the suitable divalent aliphatic hydrocarbon group having 1 or more and 10 or less carbon atoms which serves as $R^{a6}$ are the same as the examples of the suitable $R^{a3}$. As $R^{a6}$, a propane-1,3-diyl group and a butane-1,4-diyl group are preferable.

(Compound Represented by Formula (a3))

In the formula (a3), $R^{a7}$ each independently represents a hydrocarbon group having 1 or more and 10 or less carbon atoms, $R^{a8}$ each independently represents a hydrogen atom or a hydrocarbon group having 1 or more and 10 or less carbon atoms, $R^{a9}$ represents a divalent hydrocarbon group having 1 or more and 10 or less carbon atoms and p represents 0 or 1. Here, p is preferably 1. Examples of the suitable hydrocarbon group having 1 or more and 10 or less carbon atoms which serves as $R^{a7}$ and $R^{a8}$ are the same as the examples of the suitable $R^{a1}$ and $R^{a2}$. As $R^{a7}$, a methyl group, an ethyl group, an n-propyl group, an isopropyl group, an n-butyl group, an isobutyl group, a sec-butyl group, a tert-butyl group, a phenyl group and a benzyl group are preferable, and the tert-butyl group and the benzyl group are more preferable. As $R^{a8}$, a hydrogen atom, a methyl group, an ethyl group, an n-propyl group, an isopropyl group, an n-butyl group, an isobutyl group, a sec-butyl group, a tert-butyl group, a phenyl group and a benzyl group are preferable, and the methyl group, the ethyl group and the n-propyl group are more preferable. Examples of the suitable divalent aliphatic hydrocarbon group having 1 or more and 10 or less carbon atoms which serves as $R^{a9}$ are the same as the examples of the suitable $R^{a3}$. As $R^{a9}$, an ethane-1,2-diyl group, a propane-1,3-diyl group and a butane-1,4-diyl group are preferable.

(Compound Represented by Formula (a4))

In the formula (a4), $R^{a10}$ each independently represents a hydrogen atom, a hydrocarbon group having 1 or more and 10 or less carbon atoms, $R^{a11}$ each independently represents a hydrogen atom or a hydrocarbon group having 1 or more and 10 or less carbon atoms, at least one of $R^{a10}$ and $R^{a11}$ is a hydrocarbon group and $R^{a12}$ each independently represents a divalent hydrocarbon group having 1 or more and 10 or less carbon atoms. Examples of the suitable hydrocarbon group having 1 or more and 10 or less carbon atoms which serves as $R^{a10}$ and $R^{a11}$ are the same as the examples of the suitable $R^{a1}$ and $R^{a2}$. As $R^{a10}$, a methyl group, an ethyl group, an n-propyl group, an isopropyl group, an n-butyl group, an isobutyl group, a sec-butyl group, a tert-butyl group, a phenyl group and a benzyl group are preferable, and the tert-butyl group and the benzyl group are more preferable. As $R^{a11}$, a hydrogen atom, a methyl group, an ethyl group, an n-propyl group, an isopropyl group, an n-butyl group, an isobutyl group, a sec-butyl group, a tert-butyl group, a phenyl group and a benzyl group are preferable, and the methyl group, the ethyl group and the n-propyl group are more preferable. Examples of the suitable divalent aliphatic hydrocarbon group having 1 or more and 10 or less carbon atoms which serves as $R^{a12}$ are the same as the examples of the suitable $R^{a3}$. As $R^{a12}$, a methylene group and an ethane-1,2-diyl group are preferable, and the methylene group is more preferable.

Among the compounds represented by the formulas (a1) to (a4) described above, the compound represented by the formula (a1) is preferable because it is easy to synthesize and acquire it and to satisfactorily diffuse the impurity diffusion component.

Specific examples of the compound represented by the formula (a1) include compounds below.

[Formula 2]

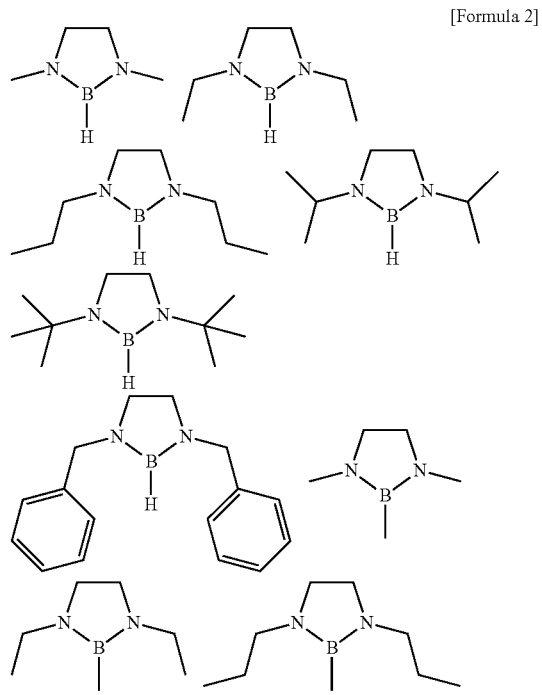

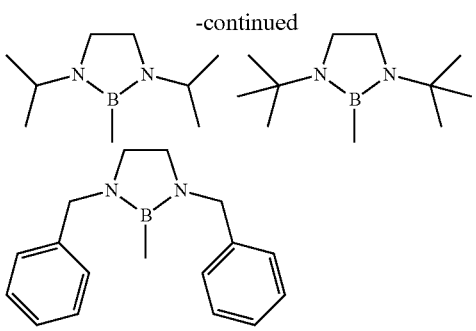

(Phosphorus Compound)

Examples of the phosphorus compound include tris (trialkylsilyl) phosphate, tris (trialkylsilyl) phosphite, phosphite esters and phosphate esters. Among them, tris (trimethylsilyl) phosphate, tris (trimethylsilyl) phosphite, trimethyl phosphate, triethyl phosphate, trimethyl phosphite and triethyl phosphite are more preferable.

When the impurity diffusion component (A) includes the phosphorus compound, the impurity diffusion component preferably includes tris (trimethylsilyl) phosphate and/or tris (trimethylsilyl) phosphite.

The content of the impurity diffusion component (A) in the diffusing agent composition is not particularly limited. With respect to the total mass of the diffusing agent composition, the content of the impurity diffusion component (A) is preferably 0.1% by mass or more and 30% by mass or less, is more preferably 0.5% by mass or more and 20% by mass or less and is particularly preferably 1% by mass or more and 15% by mass or less.

[Silane Coupling Agent (B)]

The diffusing agent composition includes the silane coupling agent (B). The silane coupling agent (B) includes a group which generates a silanol group by hydrolysis and alkyl groups, and at least one of the alkyl groups includes, in a chain and/or at an end, at least one amino group selected from a group consisting of a primary amino group, a secondary amino group and a tertiary amino group. The diffusing agent composition including the silane coupling agent (B) is used, and thus the impurity diffusion component is satisfactorily and easily diffused into the semiconductor substrate from a coating film formed of the diffusing agent composition. It is considered that this is because the hydrolytic condensation of the silane coupling agent (B) satisfactorily and easily proceeds by the influence of the amino group in the molecule, the film thickness of the coating film can be increased and a high concentration of the impurity diffusion component (A) is easily introduced.

In the present specification, that these amino groups are included "in a chain and/or at an end" described above specifically means that at least one amino group selected from a group consisting of a secondary amino group and a tertiary amino group is interposed in the chain of an alkyl group (hereinafter, in the present paragraph, which refers to a general alkyl group represented by —$C_nH_{2n+1}$ (n is an integer)), that an amino group is bonded to a secondary carbon atom or a tertiary carbon atom in the chain of an alkyl group and/or that an amino group (—$NH_2$; a primary amino group) is bonded to a carbon atom at an end of an alkyl group. The case where a tertiary amino group is interposed in the chain of an alkyl group corresponds to a structure in which a hydrogen atom in a secondary amino group interposed in the chain of the alkyl group is substituted for the alkyl group.

As the amino group, a primary amino group and a secondary alkyl group are preferable. In terms of achievement of the effects of the present invention, the number of amino groups per molecule of the silane coupling agent is preferably 1 or more and 5 or less, and is more preferably 1 or more and 3 or less. However, even with only one amino group, it is possible to achieve the effects of the present invention.

Examples of the group which is included in the silane coupling agent (B) and which generates a silanol group by hydrolysis include an alkoxy group, an isocyanate group, a dimethyl amino group and a halogen atom which bind with a silicon atom of the silane coupling agent (B). As the alkoxy group, an aliphatic alkoxy group which has 1 or more and 5 or less carbon atoms and which is linear or branched is preferable. Specific examples of the suitable alkoxy group include a methoxy group, an ethoxy group, an n-propoxy group, an isopropoxy group and an n-butoxy group. As the halogen atom, a chlorine atom, a fluorine atom, a bromine atom and an iodine atom are preferable, and the chlorine atom is more preferable.

As the group which generates a silanol group by hydrolysis, in terms of being easily subjected to hydrolysis, the ease of the handling and the acquisition of the silane coupling agent (B), an aliphatic alkoxy group or an isocyanate group which has 1 or more and 5 or less carbon atoms and which is linear or branched are preferable, and a methoxy group, an ethoxy group or the isocyanate group is more preferable.

The silane coupling agent (B) preferably includes a silane coupling agent represented by formula (1) below:

$$H_2N-R^1-Si(R^2)_m(OR^3)_{(3-m)} \qquad (1)$$

(in the formula (1), $R^1$ represents an alkylene group, the alkylene group serving as $R^1$ may be interrupted by one or more amino groups selected from a secondary amino group and a tertiary amino group, $R^2$ represents a monovalent organic group which is bonded to a silicon atom by a C—Si bond, $R^3$ represents an alkyl group and m represents an integer of 0 or more and 2 or less).

As the alkylene group serving as $R^1$ which may be interrupted by one or more amino groups selected from a secondary amino group and a tertiary amino group, an alkylene group can be mentioned which has 1 or more and 10 or less carbon atoms that may be interrupted by one or more (for example, 1 or 2) amino groups selected from a secondary amino group and a tertiary amino group. The number of carbon atoms in the alkylene group is preferably 1 or more and 8 or less, and is more preferably 1 or more and 7 or less. As $R^1$, an alkylene group which is not interrupted by one or more (for example, 1 or 2) amino groups selected from a secondary amino group and a tertiary amino group, and which has 1 or more and 6 or less carbon atoms is particularly preferable. Specific examples of the suitable $R^1$ include a methylene group, an ethane-1,2-diyl group, a propane-1,3-diyl group and a butane-1,4-diyl group, divalent groups thereof and divalent groups obtained by combining one or two amino groups.

The monovalent organic group serving as $R^2$ which is bonded to a silicon atom by a C—Si bond is not particularly limited as long as the object of the present invention is not inhibited. As a suitable example of the organic group, a hydrocarbon group and the like can be mentioned. The number of carbon atoms in the hydrocarbon group is preferably 1 or more and 20 or less. Among them, the organic group is more preferably a chain or cyclic alkyl group, an aromatic hydrocarbon group or an aralkyl group.

As the chain or cyclic alkyl group, a chain or cyclic alkyl group which has 1 or more and 12 or less carbon atoms can be mentioned, and specific examples thereof include a methyl group, an ethyl group, an n-propyl group, an isopropyl group, an n-butyl group, a sec-butyl group, an isobutyl group, a tert-butyl group, an n-pentyl group, an isopentyl group, a neopentyl group, a cyclopentyl group, an n-hexyl group, a cyclohexyl group, an n-heptyl group, a cycloheptyl group, an n-octyl group, a cyclooctyl group, an n-nonyl group, an n-decyl group, an n-undecyl group and an n-dodecyl group.

As the aromatic hydrocarbon group, an aromatic hydrocarbon group which has 1 or more and 12 or less carbon atoms can be mentioned, and specific examples thereof include a phenyl group, a 2-methylphenyl group, a 3-methylphenyl group, a 4-methylphenyl group, a 2-ethylphenyl group, a 3-ethylphenyl group, a 4-ethylphenyl group, an α-naphthyl group, a β-naphthyl group and a biphenylyl group.

As the aralkyl group, an aralkyl group which has 1 or more and 12 or less carbon atoms can be mentioned, and specific examples thereof include a benzyl group, a phenetyl group, an α-naphthylmethyl group, a β-naphthylmethyl group, a 2-α-naphthylethyl group and a 2-β-naphthylethyl group. As the monovalent organic group serving as $R^2$ which is bonded to a silicon atom by a C—Si bond, a methyl group or an ethyl group is preferable, and a methyl group is more preferable. As the alkyl group serving as $R^3$, a chain or cyclic alkyl group which has 1 or more and 12 or less carbon atoms can be mentioned, and specific examples thereof include a methyl group, an ethyl group, an n-propyl group, an isopropyl group, an n-butyl group, a sec-butyl group, an isobutyl group, a tert-butyl group, an n-pentyl group, an isopentyl group, a neopentyl group, a cyclopentyl group, an n-hexyl group, a cyclohexyl group, an n-heptyl group, a cycloheptyl group, an n-octyl group, a cyclooctyl group, an n-nonyl group, an n-decyl group, an n-undecyl group and an n-dodecyl group. Here, m is preferably 0 or 1, and is more preferably 0.

Specific examples of the preferable silane coupling agent (B) include 3-aminopropyltrimethoxy silane, 3-aminopropyltriethoxy silane, N-(2-aminoethyl)-3-aminopropylmethyldimethoxy silane, N-(2-aminoethyl)-3-aminopropyltrimethoxy silane, N-(2-aminoethyl)-3-aminopropyltriethoxy silane, 3-[2-(2-aminoethylaminoethylamino) propyl] trimethoxy silane which are each represented by formulas (a) to (f) below. Among these silane coupling agents (B), one type may be used alone or two or more types may be combined so as to be used. The partial hydrolysis condensates of these compounds can also be used as the silane coupling agent (B).

In the mass of the silane coupling agent (B), the mass of the silane coupling agent represented by the formula (1) described above is preferably 50% by mass or more, is more preferably 70% by mass or more, is particularly preferably 90% by mass or more and is most preferably equal to 100% by mass.

Although the content of the silane coupling agent (B) in the diffusing agent composition is not particularly limited, with respect to the total mass of the diffusing agent composition, the content of the silane coupling agent (B) is preferably 0.01% by mass or more and 5.0% by mass or less, is more preferably 0.03% by mass or more and 3.0% by mass or less, and is particularly preferably 0.05% by mass or more and 2.0% by mass or less. The diffusing agent composition includes the silane coupling agent (B) at such concentrations, and thus the impurity diffusion component (A) is satisfactorily and easily diffused into the semiconductor substrate from the coating film formed of the diffusing agent composition.

[Organic Solvent (S)]

The diffusing agent composition preferably includes an organic solvent (S) as a solvent in that a coating film having a desired film thickness is easily formed by coating. The type of organic solvent (S) is not particularly limited as long as the object of the present invention is not inhibited.

Preferably, when the diffusing agent composition includes the silane coupling agent (B), the diffusing agent composition substantially does not include water. That the diffusing agent composition substantially does not include water means that the diffusing agent composition does not include such an amount of water that the silane coupling agent (B) is hydrolyzed so as not to obtain the desired effect exerted by the addition thereof.

Specific examples of the organic solvent (S) include: monoethers of glycols such as ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether, propylene glycol monobutyl ether, diethylene glycol monomethyl ether, diethylene glycol monoethyl ether, diethylene glycol monopropyl ether, diethylene glycol monobutyl ether, diethylene glycol monophenyl ether, dipropylene glycol monomethyl ether, dipropylene glycol monoethyl ether, dipropylene glycol monopropyl ether, dipropylene glycol monobutyl ether, dipropylene glycol monophenyl ether, triethylene glycol monomethyl ether, triethylene glycol monoethyl ether, tripropylene glycol monomethyl ether and tripropylene glycol monoethyl ether; monoethers such as diisopentyl ether (diisoamyl ether), dibutyl ether, diisobutyl ether, tert-butyl methyl ether, benzyl methyl ether, benzyl ethyl ether, dioxane, tetrahydrofuran, anisole, perfluoro-2-butyl tetrahydrofuran and perfluorotetrahydrofuran; chain diethers of glycols such as ethylene glycol dimethyl ether, ethylene glycol diethyl ether, ethylene glycol dipropyl ether, ethylene glycol dibutyl ether, propylene glycol dimethyl ether, propylene glycol diethyl ether, propylene glycol dipropyl ether, propylene glycol dibutyl ether, diethylene glycol dimethyl ether, diethylene glycol diethyl ether, diethylene glycol dipropyl ether, diethylene glycol dibutyl ether, dipropylene glycol dimethyl ether, dipropylene glycol diethyl ether, dipropylene glycol dipropyl ether and dipropylene glycol dibutyl ether; cyclic diethers such as 1,4-dioxane; ketones such as 1-octanone, 2-octanone, 1-nonanone, 2-nonanone, acetone, 2-heptanone, 4-heptanone, 1-hexanone, 2-hexanone, 3-pentanone, diisobutyl ketone, cyclohexanone, methylcyclohexanone, phenylacetone, methyl ethyl ketone, methyl isobutyl ketone, ethyl isobutyl ketone, acetyl acetone, acetonyl acetone, ionone, diacetonyl alcohol, acetyl carbinol, acetophenone, methylnaphthyl ketone and isophorone; esters such as methyl acetate, butyl acetate, ethyl acetate, isopropyl acetate, pentyl acetate, isopentyl acetate, ethyl methoxy acetate, ethyl ethoxy acetate, ethylene glycol monomethyl ether acetate, ethylene glycol monoethyl ether acetate, ethylene glycol monopropyl ether acetate, ethylene glycol monobutyl ether acetate, ethylene glycol monophenyl ether acetate, propylene glycol monomethyl ether acetate, propylene glycol monoethyl ether acetate, propylene glycol monopropyl ether acetate, propylene glycol monobutyl ether acetate, propylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl-3-methoxypropionate, ethyl-3-methoxypropionate, ethyl-3-ethoxypropionate, propyl-3-methoxypropionate and isopropyl-3-methoxypropionate, propylene carbonate and γ-butyrolactone; amide solvents having no active hydrogen atom such as N-methyl-2-pyrrolidone, N,N-dimethylacetamide, N,N-dimethylformamide, hexamethylphosphoric triamide and 1,3-dimethyl-2-imidazolidinone; sulfoxides such as dimethylsulfoxide; aliphatic hydrocarbon solvents which may contain a halogen such as pentane, hexane, octane, decane, 2,2,4-trimethylpentane, 2,2,3-trimethylhexane, perfluorohexane, perfluoroheptane, limonene and pinene; aromatic hydrocarbon solvents such as benzene, toluene, xylene, ethylbenzene, propylbenzene, 1-methylpropylbenzene, 2-methylpropylbenzene, diethylbenzene, ethylmethylbenzene, trimethylbenzene, ethyldimethylbenzene and dipropylbenzene; monohydric alcohols such as methanol, ethanol, n-propanol, isopropanol, butanol, isobutanol, 2-methoxyethanol, 2-ethoxyethanol, 3-methyl-3-methoxybutanol, hexanol, cyclohexanol, benzyl alcohol and 2-phenoxyethanol; and glycols such as ethylene glycol, propylene glycol, diethylene glycol and dipropylene glycol. In the illustration of the preferred organic solvents (S) described above, organic solvents containing an ether bond and an ester bond are classified into esters. They may be used singly or two or more types may be combined so as to be used.

Since the diffusing agent composition includes the silane coupling agent (B), the organic solvent (S) which does not have a functional group reacting with the silane coupling agent (B) is preferably used. In particular, when the silane coupling agent (B) includes an isocyanate group, the organic solvent (S) which does not have a functional group reacting with the silane coupling agent (B) is preferably used.

The functional group reacting with the silane coupling agent (B) includes both a functional group which directly reacts with a group that generates a hydroxyl group by hydrolysis and a functional group which reacts with a hydroxyl group (silanol group) generated by hydrolysis. Examples of the functional group reacting with the silane coupling agent (B) include a hydroxyl group, a carboxyl group, an amino group and a halogen atom.

Examples of the suitable organic solvent which does not have a functional group reacting with the silane coupling agent (B) include, among the specific examples of the organic solvents (S) described above, the organic solvents described as the specific examples of mono ethers, chain diethers, cyclic diethers, ketones, esters, amide solvents having no active hydrogen atom, sulfoxides, aliphatic hydrocarbon solvents which may include halogens and aromatic hydrocarbon solvents.

[Other Components]

The diffusing agent composition may contain various additives such as a surfactant, an antifoaming agent, a pH adjustor and a viscosity modifier as long as the object of the present invention is not inhibited. The diffusing agent composition may further contain a binder resin in order to improve the coating and the film formation. Various resins can be used as the binder resin, and an acrylic resin is preferable.

The predetermined amounts of components described above are each uniformly mixed, and thus it is possible to manufacture the diffusing agent composition.

<<Method of Manufacturing Semiconductor Substrate>>

A method of manufacturing a semiconductor substrate includes: forming a coating film by applying the diffusing agent composition described above; and diffusing the impurity diffusion component (A) in the diffusing agent composition into the semiconductor substrate. In the following description, a step of forming the coating film is also referred to as a "coating step", and a step of diffusing the impurity diffusion component (A) into the semiconductor substrate is also referred to as a "diffusion step". The coating step and the diffusion step will be sequentially described below.

[Coating Step]

In the coating step, the diffusing agent composition is applied onto the semiconductor substrate so as to form the coating film. The coating step will be described below in the order of the diffusing agent composition, the semiconductor substrate and the coating method.

(Semiconductor Substrate)

As the semiconductor substrate, various substrates that are conventionally used as a target into which the impurity diffusion component is diffused can be used without any restriction in particular. As the semiconductor substrate, a silicon substrate is typically used.

The semiconductor substrate may have a three-dimensional structure on its surface onto which the diffusing agent composition is applied. According to the present invention, even when the semiconductor substrate has, on its surface, the three-dimensional structure, in particular, a three-dimensional structure having a small pattern on a nanometer scale, the impurity diffusion component can be diffused satisfactorily and uniformly into the semiconductor substrate, for example, by forming the thin coating film on the semiconductor substrate through the application of the diffusing agent composition described above so as to have a film thickness of 1 nm or more and 100 nm or less.

The shape of the pattern is not particularly limited. However, typical examples thereof include linear or curved lines or grooves whose cross-sectional shape is rectangular and a hole shape.

When the semiconductor substrate has, on its surface, a pattern in which a plurality of parallel lines serving as the three-dimensional structure are repeatedly arranged, a width between the lines can be set 1 μm or less, 100 nm or less, 60 nm or less, or 20 nm or less. The height of the lines can be set 30 nm or more, 100 nm or more, 1 μm or more, or 5 μm or more.

(Coating Method)

The film thickness of the coating film formed of the diffusing agent composition is not particularly limited. In terms of both the satisfactory diffusion of the impurity diffusion component (A) and the ease of separation of the film left after the diffusion, the film thickness of the coating film formed of the diffusing agent composition is preferably 5 nm or more and 100 nm or less, is more preferably 10 nm or more and 80 nm or less and is particularly preferably 15 nm or more and 50 nm or less. The film thickness of the coating film refers to the film thickness of the coating film which is subjected to the diffusion step. For example, when rinsing is performed with an organic solvent before the diffusion step, the film thickness after the rinsing is assumed to be the film thickness of the coating film.

The coating of the diffusing agent composition is preferably performed under conditions in which the relative humidity of an atmosphere around the semiconductor substrate is 40% or less and is preferably 30% or less. Although the mechanism is not clear, the coating film is formed under the atmosphere of the humidity described above, and thus it is possible to more satisfactorily diffuse, with the diffusing agent composition, the impurity diffusion component (A) from the formed coating film to the semiconductor substrate.

Although the lower limit of the relative humidity of the atmosphere around the semiconductor substrate when the coating of the diffusing agent composition is performed is not particularly limited as long as it is possible to satisfactorily diffuse the impurity diffusion component (A), the lower limit is preferably 5% or more and is more preferably 10% or more, so that condensation by the hydrolysis of the silane coupling agent (B) is made to proceed satisfactorily.

A method of adjusting the relative humidity around the semiconductor substrate is not particularly limited. Examples of the method include a method of installing a coating device within a chamber whose humidity can be adjusted and a method of covering, with a wall or a sheet, the surrounding of an area where the semiconductor substrate is coated with the diffusing agent composition such that a gap is minimized and then adjusting the relative humidity within the chamber surrounded with a commercial humidity adjusting device so as to be within a predetermined range.

The coating film may be heated to about a temperature of 100° C. or more and 300° C. or less, and may be preferably heated to about a temperature of 150° C. or more and 250° C. or less. Although the heating time is not particularly limited, the heating time is, for example, about a time of 60 seconds or more and 180 seconds or less. The heating described above is performed, and thus it is recognized that the stability of the film tends to be enhanced.

A method of applying the diffusing agent composition is not particularly limited as long as the coating film having a desired film thickness can be formed. As the method of applying the diffusing agent composition, a spin coat method, an inkjet method and a spray method are preferable, and the spin coat method is more preferable.

The film thickness of the coating film is set to an arbitrary film thickness as necessary according to the shape of the semiconductor substrate and the degree of diffusion of the impurity diffusion component (A) which is arbitrarily set.

It is also preferable to rinse the surface of the semiconductor substrate with an organic solvent while the diffusing agent composition is being applied to the surface of the semiconductor substrate. The surface of the semiconductor substrate is rinsed during the formation of the coating film, and thus the film thickness of the coating film can be made more uniform. In particular, when the semiconductor substrate has a three-dimensional structure on its surface, the film thickness of the coating film is easily increased at the bottom portion (step portion) of the three-dimensional structure. However, the surface of the semiconductor substrate is rinsed after the formation of the coating film, and thus the film thickness of the coating film can be made uniform.

As the organic solvent used for the rinsing, the organic solvent which may contain the diffusing agent composition and which is described previously can be used.

[Diffusion Step]

In the diffusion step, the impurity diffusion component (A) in the thin coating film formed of the diffusing agent composition on the semiconductor substrate is diffused into the semiconductor substrate. The method of diffusing the impurity diffusion component (A) into the semiconductor substrate is not particularly limited as long as the method is a method of diffusing the impurity diffusion component (A), by heating, from the coating film formed of the diffusing agent composition.

As a typical method, a method of heating, in a heating furnace such as an electric furnace, the semiconductor substrate having the coating film formed of the diffusing agent composition is mentioned. Here, the heating conditions are not particularly limited as long as the impurity diffusion component (A) is diffused to the desired extent.

In general, under an atmosphere including oxygen, an organic substance in the coating film is fired so as to be removed, thereafter under an atmosphere of an inert gas, the semiconductor substrate is heated and thus the impurity diffusion component (A) is diffused into the semiconductor substrate. The heating for firing the organic substance is preferably performed at a temperature of 300° C. or more and 1000° C. or less and is more preferably performed at about a temperature of 400° C. or more and 800° C. or less, and the heating is also preferably performed for 1 second or more and 10 minutes or less and is more preferably performed for 5 seconds or more and 5 minutes or less. The heating for diffusing the impurity diffusion component (A) is preferably performed at a temperature of 700° C. or more and 1400° C. and is more preferably performed at a temperature of 700° C. or more and 1200° C. or less, and the heating is also preferably performed for 1 minute or more and 120 minutes or less and is more preferably performed for 5 minutes or more and 60 minutes or less.

When the semiconductor substrate can be rapidly increased in temperature to a predetermined diffusion temperature at a rate of temperature increase of 25° C./second or more, the holding time of the diffusion temperature may be so short as to be 60 seconds or less, 30 seconds or less, 10 seconds or less, or less than 1 second. In this case, in a shallow region of the surface of the semiconductor substrate, a high concentration of impurity diffusion component (A) is easily diffused.

According to the method described above, the desirable thin film can be formed with the diffusing agent composition described above on the semiconductor substrate, and thus it is possible to satisfactorily diffuse the impurity diffusion component into the semiconductor substrate.

EXAMPLES

Although the present invention will be more specifically described below using examples, the present invention is not limited to the examples below.

Examples 1 to 4 and Comparative Examples 1 to 9

As the impurity diffusion component ((A) component), N,N'-di-tert-butyl-1,3-diazaborocylopentane represented by formula below was used.

[Formula 3]

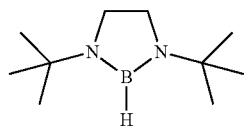

As the silane coupling agent ((B) component), the silane coupling agents of B1 to B7 below were used.

B1: 3-aminopropyltriethoxy silane
B2: 3-aminopropyltrimethoxy silane
B3: methyl triethoxy silane
B4: dimethyldiethoxy silane
B5: phenyltrimethoxy silane
B6: 3-glycidoxypropyltrimethoxy silane The (A) component and the (B) components of types described in table 1 were dissolved in propylene glycol monomethyl ether acetate (PGMEA) such that the concentration of the (A) component was 5% by mass and that the concentrations of the (B) components were concentrations described in table 1, and thus the diffusing agent compositions for the examples and the comparative examples were obtained. In comparative example 1, the (B) components were not used.

A silicon substrate (6 inches, n-type) which was subjected to washing using a hydrofluoric acid aqueous solution having a concentration of 0.5% by mass and washing using ion exchange distilled water and was thereafter dried and which had a flat surface was prepared as a substrate serving as a diffusion target. Under conditions of a relative humidity of 30%, with a spin coater, the diffusing agent compositions of the examples and the comparative examples were individually applied to the surfaces of the silicon substrates, thereafter rinsing using propylene glycol monomethyl ether acetate (PGMEA) was performed and thus coating films were formed. The film thicknesses of the formed coating films are described in table 1. Since in the diffusing agent composition of comparative example 9, almost no film was left after the rinsing, the diffusion test was not performed.

After the formation of the coating film, the diffusion processing of the impurity diffusion components was performed according to the following method. With a rapid thermal anneal device (lamp anneal device), under an atmosphere of nitrogen having a flow rate of 1 L/m, heating was performed under conditions of a rate of temperature increase of 25° C./second, and the diffusion processing was performed at a diffusion temperature of 1050° C. for a diffusion time of 10 seconds. The start point of the diffusion time is the time when the temperature of the substrate reached the predetermined diffusion temperature. After the completion of the diffusion, the temperature of the silicon substrate was rapidly cooled to room temperature.

The silicon substrate after the diffusion was processed with a hydrofluoric acid aqueous solution having a concentration of 0.5% by mass for 5 minutes, and the film left on the silicon substrate after the diffusion processing was separated. Then, washing using ion exchange distilled water and drying were performed, and thereafter the sheet resistance values of the silicon substrates were measured. The results of the measurement of the sheet resistance values were shown in table 1.

TABLE 1

| | Composition of diffusing agent composition | | | Film thickness of coating film (nm) | Sheet resistance value (Ω/sq.) |
|---|---|---|---|---|---|
| | (A) Component (Mass %) | (B) Component Type | (Mass %) | | |
| Example 1 | 5 | B1 | 0.1 | 14.3 | 170 |
| Example 2 | 5 | B1 | 0.5 | 25.5 | 178 |
| Example 3 | 5 | B1 | 1.0 | 20.8 | 54 |
| Example 4 | 5 | B2 | 1.0 | 24.0 | 98 |
| Comparative Example 1 | 5 | — | — | 6.0 | 840 |

TABLE 1-continued

| | Composition of diffusing agent composition | | | Film thickness of coating film (nm) | Sheet resistance value (Ω/sq.) |
|---|---|---|---|---|---|
| | (A) Component (Mass %) | (B) Component Type | (Mass %) | | |
| Comparative Example 2 | 5 | B3 | 0.5 | 7.8 | 3287 |
| Comparative Example 3 | 5 | B4 | 0.5 | 4.2 | 1041 |
| Comparative Example 4 | 5 | B4 | 1.0 | 5.7 | 818 |
| Comparative Example 5 | 5 | B4 | 3.0 | 6.1 | 550 |
| Comparative Example 6 | 5 | B4 | 10.0 | 5.6 | 8346 |
| Comparative Example 7 | 5 | B5 | 0.5 | 4.5 | 540 |
| Comparative Example 8 | 5 | B5 | 1.0 | 6.8 | 293 |
| Comparative Example 9 | 5 | B6 | 1.0 | — | — |

It is found from examples 1 to 4 that a diffusing agent composition including a combination of the boron compound serving as the impurity diffusion component (A) and the silane coupling agent (B) of the predetermined structure including the amino group is used, and that thus it is possible to satisfactorily diffuse the impurity diffusion component (A) into the semiconductor substrate. On the other hand, it is found from comparative examples 1 to 9 that when the diffusing agent composition includes, instead of the silane coupling agent (B) of the predetermined structure including the amino group, alkoxysilane which does not include the amino group and the diffusing agent composition does not include the component corresponding to the silane coupling agent (B), it is difficult to satisfactorily form the coating film in the first place, and it is also difficult to satisfactorily diffuse the impurity diffusion component (A) into the semiconductor substrate.

Examples 5 to 10 and Comparative Example 10

As the impurity diffusion component ((A) component), tris (trimethylsilyl) phosphate was used. As the silane coupling agent ((B) component), B1 (3-aminopropyltriethoxy silane) and B2 (3-aminopropyltrimethoxy silane) described previously were used.

The (A) component and the (B) components of types described in table 2 were dissolved in propylene glycol monomethyl ether acetate (PGMEA) such that the concentrations of the (A) component were concentrations described in table 2 and that the concentrations of the (B) components were concentrations described in table 2, and thus the diffusing agent compositions for the examples and the comparative example were obtained. In comparative example 10, the (B) components were not used.

A silicon substrate (6 inches, p-type) which was subjected to washing using a hydrofluoric acid aqueous solution having a concentration of 0.5% by mass and washing using ion exchange distilled water and was thereafter dried and which had a flat surface was prepared as a substrate serving as a diffusion target. Under conditions of a relative humidity of 30%, with the spin coater, the diffusing agent compositions of the examples and the comparative examples were individually applied to the surfaces of the silicon substrates, thereafter rinsing using propylene glycol monomethyl ether acetate (PGMEA) was performed and thus coating films were formed. The film thicknesses of the formed coating films are described in table 2. Since in the diffusing agent composition of comparative example 10, almost no film was left after the rinsing, the diffusion test was not performed.

After the formation of the coating film, the diffusion processing of the impurity diffusion components was performed according to the following method. With the rapid thermal anneal device (lamp anneal device), under an atmosphere of nitrogen having a flow rate of 1 L/m, heating was performed under conditions of a rate of temperature increase of 25° C./second, and the diffusion processing was performed at a diffusion temperature of 1050° C. for a diffusion time of 10 seconds. The start point of the diffusion time is the time when the temperature of the substrate reached the predetermined diffusion temperature. After the completion of the diffusion, the temperature of the silicon substrate was rapidly cooled to room temperature.

The silicon substrate after the diffusion was processed with a hydrofluoric acid aqueous solution having a concentration of 0.5% by mass for 5 minutes, and the film left on the silicon substrate after the diffusion processing was separated. Then, washing using ion exchange distilled water and drying were performed, and thereafter the sheet resistance values of the silicon substrates were measured. The results of the measurement of the sheet resistance values are shown in table 2.

For the silicon substrate on which the diffusion processing using the diffusing agent composition of example 6 was performed, a phosphorus concentration (atoms/cc) and a diffusion depth were measured with a quadrupole secondary ion mass spectrometry (Q-SIMS) device. Consequently, it was found that when the diffusing agent composition of example 7 is used to perform impurity diffusion into the semiconductor substrate, it is possible to satisfactorily diffuse the impurity diffusion component such that the phosphorus concentrations in narrow regions whose depths are 10 nm and 20 nm are so high as to exceed $10^{20}$ (atoms/cc).

TABLE 2

| | Composition of diffusing agent composition | | | Film thickness of coating film (nm) | Sheet resistance value (Ω/sq.) |
|---|---|---|---|---|---|
| | (A) Component (Mass %) | (B) Component Type | (Mass %) | | |
| Example 5 | 5 | B1 | 1.0 | 17.0 | 377 |
| Example 6 | 10 | B1 | 1.0 | 27.0 | 141 |
| Example 7 | 20 | B1 | 1.0 | 27.8 | 175 |
| Example 8 | 30 | B1 | 1.0 | 24.5 | 115 |
| Example 9 | 10 | B1 | 0.5 | 22.1 | 258 |
| Example 10 | 10 | B2 | 1.0 | 41.8 | 97 |
| Comparative Example 10 | 5 | — | — | — | — |

It is found from examples 5 to 10 that even when the phosphorus compound serving as the impurity diffusion component (A) is used, the diffusing agent composition including a combination of the phosphorus compound serving as the impurity diffusion component (A) and the silane coupling agent (B) of the predetermined structure including the amino group is used, and that thus it is possible to satisfactorily diffuse the impurity diffusion component (A) into the semiconductor substrate. On the other hand, it is found from comparative example 10 that when the diffusing agent composition does not include the component corresponding to the silane coupling agent (B), it is difficult to satisfactorily form the coating film in the first place.

What is claimed is:

1. A diffusing agent composition which is used for diffusing an impurity into a semiconductor substrate,
   wherein the diffusing agent composition comprises an impurity diffusion component (A) and a silane coupling agent (B),
   the silane coupling agent (B) comprises a group which generates a silanol group by hydrolysis and alkyl groups and
   at least one of the alkyl groups comprises, in a chain and/or at an end, at least one amino group selected from the group consisting of a primary amino group, a secondary amino group and a tertiary amino group.

2. The diffusing agent composition according to claim 1, wherein the silane coupling agent comprises a silane coupling agent represented by formula (1) below:

wherein $R^1$ represents an alkylene group, the alkylene group serving as $R^1$ may be interrupted by one or more amino groups selected from a secondary amino group and a tertiary amino group, $R^2$ represents a monovalent organic group which is bonded to a silicon atom by a C—Si bond, $R^3$ represents an alkyl group and m represents an integer of 0 or more and 2 or less.

3. The diffusing agent composition according to claim 1, wherein the impurity diffusion component (A) is a boron compound or a phosphorus compound.

4. The diffusing agent composition according to claim 3, wherein the impurity diffusion component (A) comprises a boron compound represented by formula (a1) below:

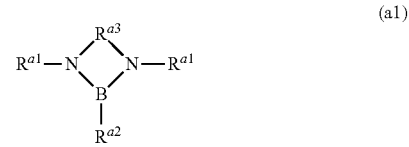

wherein each $R^{a1}$ independently represents a hydrogen atom, a hydrocarbon group having 1 or more and 10 or less carbon atoms, $R^{a2}$ represents a hydrogen atom or a hydrocarbon group having 1 or more and 10 or less carbon atoms, at least one of $R^{a1}$ and $R^{a2}$ is a hydrocarbon group and $R^{a3}$ represents a divalent aliphatic hydrocarbon group having 1 or more and 10 or less carbon atoms.

5. The diffusing agent composition according to claim 3, wherein the impurity diffusion component (A) comprises tris (trimethylsilyl) phosphate and/or tris (trimethylsilyl) phosphite.

6. A method of manufacturing a semiconductor substrate, the method comprising:
   forming a coating film by applying the diffusing agent composition according to claim 1 onto the semiconductor substrate; and
   diffusing the impurity diffusion component (A) in the diffusing agent composition into the semiconductor substrate.

7. The method of manufacturing a semiconductor substrate according to claim 6, wherein rinsing with an organic solvent is performed during or after application of the diffusing agent composition.

8. The method of manufacturing a semiconductor substrate according to claim 6, wherein a film thickness of the coating film which is subjected to the diffusion of the impurity diffusion component (A) is 5 nm or more and 100 nm or less.

9. A method of diffusing an impurity into a semiconductor substrate, the method comprising applying the diffusing agent composition according to claim 1.

* * * * *